(12) United States Patent
Lee et al.

(10) Patent No.: US 9,970,974 B2
(45) Date of Patent: May 15, 2018

(54) ON-LINE STATUS DIAGNOSIS DEVICE AND ON-LINE STATUS DIAGNOSIS METHOD FOR ELECTRIC POWER UTILITIES

(71) Applicant: LSIS CO., LTD., Anyang-si, Gyeonggi-do (KR)

(72) Inventors: Do Hoon Lee, Cheongju-si (KR); Chan Yong Park, Cheongju-si (KR); Hyun Ho Kwon, Cheongju-si (KR); Jong Ung Choi, Cheongju-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 372 days.

(21) Appl. No.: 14/799,442

(22) Filed: Jul. 14, 2015

(65) Prior Publication Data
US 2016/0041217 A1   Feb. 11, 2016

(30) Foreign Application Priority Data
Aug. 11, 2014 (KR) .................. 10-2014-0103883

(51) Int. Cl.
*G01R 31/00* (2006.01)
*G01R 31/02* (2006.01)
(Continued)

(52) U.S. Cl.
CPC ............ *G01R 31/021* (2013.01); *G01R 31/40* (2013.01); *G05B 23/0221* (2013.01)

(58) Field of Classification Search
CPC ... G01R 31/021; G01R 31/40; G05B 23/0221
(Continued)

(56) References Cited

U.S. PATENT DOCUMENTS

| 9,664,759 B2* | 5/2017 | James ................ G01R 33/4818 |
| 2014/0215056 A1* | 7/2014 | Malakhova ........... H04L 43/024 709/224 |
| 2014/0350777 A1* | 11/2014 | Kawai ................. G07C 5/0808 701/32.3 |

FOREIGN PATENT DOCUMENTS

| EP | 2477088 | 7/2012 |
| KR | 10-1995-0026125 | 9/1995 |

(Continued)

OTHER PUBLICATIONS

European Patent Office Application Serial No. 15177474.2, Search Report dated Jan. 29, 2016, 6 pages.
(Continued)

*Primary Examiner* — Anthan Tran
(74) *Attorney, Agent, or Firm* — K&L Gates LLP (57) ABSTRACT

The present invention is to provide an on-line status diagnosis device for an electric power utilities, in which sampling and data transmission rates are differentiated according to a degree of risk of degradation status data. The on-line status diagnosis device includes a sensor for providing a degradation detection signal of the electric power utilities, a data acquisition unit (DAU) for acquiring and providing degradation detection data, and a communication unit for transmitting the degradation detection data to the outside. The DAU includes an analog-digital converter for acquiring degradation detection data as digital data by converting the degradation detection signal from the sensor into a digital signal, and a microcomputer for determining a degree of risk by comparing the degradation detection data with at least one predetermined risk determination reference value, and outputting a control signal to the analog-digital converter to change a sampling rate and a report rate.

5 Claims, 4 Drawing Sheets

(51) Int. Cl.
    *G05B 23/02*     (2006.01)
    *G01R 31/40*     (2014.01)

(58) Field of Classification Search
    USPC .......................................................... 702/58
    See application file for complete search history.

(56) References Cited

FOREIGN PATENT DOCUMENTS

| | | |
|---|---|---|
| KR | 10-2004-0020270 | 3/2004 |
| WO | 13/156026 | 10/2013 |

OTHER PUBLICATIONS

Korean Intellectual Property Office Application Serial No. 10-2014-0103883, Office Action dated Jun. 5, 2015, 4 pages.

\* cited by examiner

ON-LINE STATUS DIAGNOSIS DEVICE AND ON-LINE STATUS DIAGNOSIS METHOD FOR ELECTRIC POWER UTILITIES

CROSS-REFERENCE TO RELATED APPLICATIONS

Pursuant to 35 U.S.C. § 119(a), this application claims the benefit of earlier filing date and right of priority to Korean Patent Application No. 10-2014-0103883, filed on Aug. 11, 2014, the contents of which are all hereby incorporated by reference herein in its entirety.

BACKGROUND OF THE DISCLOSURE

1. Field of the Disclosure

The present disclosure relates to an on-line status diagnosis device and an on-line status diagnosis method for electric power utilities, and particularly, to an on-line status diagnosis device and an on-line status diagnosis method for the electric power utilities, which enable a data acquisition unit (hereinafter, referred to as a DAU) used in the on-line status diagnosis device and the on-line status diagnosis method to perform efficient processing in processing after data acquisition, such as communication and database processing.

2. Description of the Conventional Art

An on-line status diagnosis device and an on-line status diagnosis method for electric power utilities according to one example of the conventional art will be described with reference to FIGS. 1 and 2.

Figure 1:
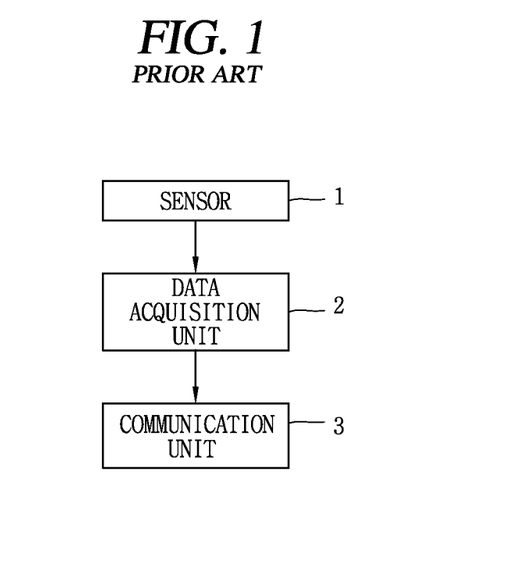
FIG. 1 is a block diagram illustrating a configuration of an on-line status diagnosis device for electric power utilities according to a conventional art.

As can be seen in FIG. 1, the on-line status diagnosis device for the electric power utilities according to an example of the conventional art includes a sensor 1, a DAU 2, and a communication unit 3.

The sensor 1 is a sensor capable of detecting a degradation status of the electric power utilities. For example, the sensor 1 may be configured as a partial discharging sensor which provides an electrical detection signal by sensing a partial discharging signal generated based on a degradation status of the electric power utilities.

The DAU 2 is connected to an output terminal of the sensor 1, and includes an analog-digital converter and a microcomputer. Thus, the DAU 2 converts a degradation status detection signal that is an analog signal provided from the sensor 1 into a digital signal through the analog-digital converter, thereby acquiring digital data. In this case, the microcomputer controls the analog-digital converter to sample the degradation status detection signal at a constant sampling rate.

The communication unit 3 is connected to an output terminal of the DAU 2, to transmit, for example, to an supervisory device, degradation status data of the electric power utilities, into which the DAU2 digital-converts the degradation status signal.

Figure 2:
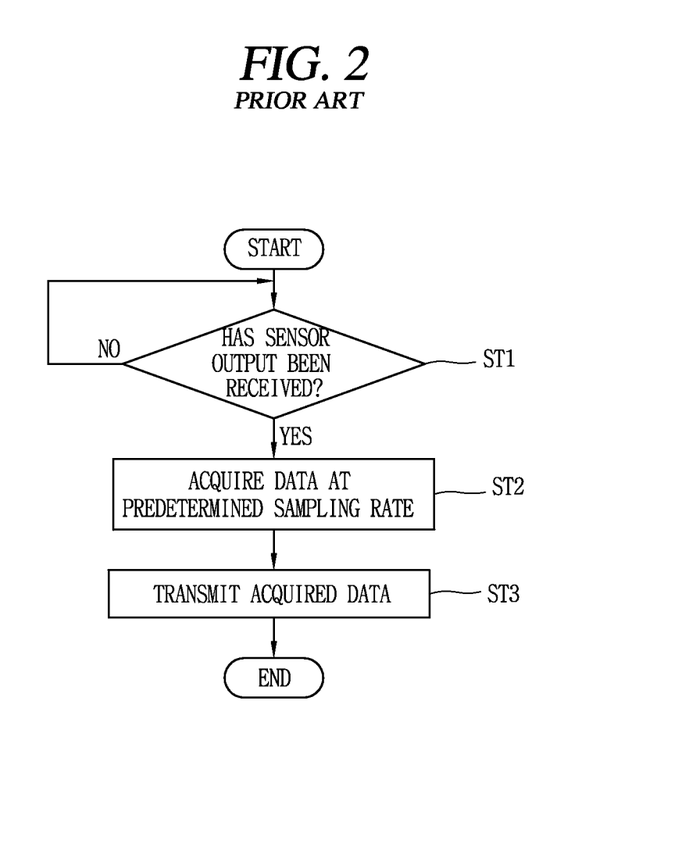
FIG. 2 is a flowchart illustrating a configuration of an on-line status diagnosis method for the electric power utilities according to the conventional art.

The on-line status diagnosis method for the electric power utilities according to the example of the conventional art, as can be seen in FIG. 2, includes receiving a sensor output (ST1), acquiring data at a predetermined sampling rate (ST2), and transmitting the acquired data (ST3).

In the receiving of the sensor output (ST1), the analog-digital converter of the DAU 2 receives a degradation status detection signal from the sensor 1.

In the acquiring of the data at the predetermined sampling rate (ST2), the analog-digital converter samples the degradation status detection signal that is an analog signal at the predetermined sampling rate to be converted into a digital signal, thereby acquiring digital data.

The transmitting of the acquired data (ST3), degradation status detection data acquired as the digital data is transmitted to, for example, a supervisory device.

However, in the on-line status diagnosis device and the on-line status diagnosis method for the electric power utilities according to the conventional art as described above, as an analog-digital converter having a fast sampling rate can be purchased at a competitive price as compared with the past, a large quantity of degradation status detection data can be acquired at the fast sampling rate. On the other hand, degradation status detection data is acquired at a constant sampling rate without considering the degree of importance or risk. Hence, in subsequent communication and database processing, a heavy burden is imposed a communication device, a communication line, and a database device, which perform the corresponding processing, and the processing rate (speed) is lowered.

SUMMARY OF THE DISCLOSURE

Therefore, an aspect of the detailed description is to provide an on-line status diagnosis device and an on-line status diagnosis method for an electric power utilities, in which sampling and data transmission rates are differentiated according to a degree of importance (risk) of degradation status data, so that it is reduce a communication load and a database load, thereby improving efficiency.

To achieve these and other advantages and in accordance with the purpose of this disclosure, as embodied and broadly described herein, an on-line status diagnosis device for an electric power utilities according to this invention, which comprises a degradation detection sensor configured to provide a degradation detection signal as an electrical analog signal by detecting a degradation status of the electric power utilities, a data acquisition unit (abbreviated as "DAU" hereinafter) configured to acquire and provide degradation detection data based on the degradation detection signal, and a communication unit configured to transmit the degradation detection data from the DAU to the outside of the on-line status diagnosis device, wherein the DAU comprises:

an analog-digital converter configured to acquire degradation detection data as digital data by converting the degradation detection signal from the degradation detection sensor into a digital signal; and a microcomputer configured to determine a degree of risk by comparing the degradation detection data with at least one predetermined risk determination reference value, if the degree of risk is high, output a control signal to the analog-digital converter to increase a sampling rate that is a number of sampling times of detection data per unit time in the analog-digital converter and also output the degradation detection data to quicken a report rate that is a time required to transmit data of a predetermined number, and if the degree of risk is low, output a control signal to the analog-digital converter to decrease the sampling rate of the analog-digital converter and also output the degradation detection data to decrease the report rate.

To achieve these and other advantages and in accordance with the purpose of this disclosure, as embodied and broadly described herein, an on-line status diagnosis method for electric power utilities according to this invention, which uses a degradation detection sensor configured to provide a degradation detection signal as an electrical analog signal by detecting a degradation status of the electric power utilities, a DAU configured to acquire and provide degradation detection data based on the degradation detection signal and having an analog-digital converter and a microcomputer, and a communication unit configured to transmit the degradation detection data from the DAU to the outside of an on-line status diagnosis device, the on-line status diagnosis method comprising:

acquiring, by the analog-digital converter included in the DAU, degradation detection data by converting the degradation detection signal into a digital signal, based on an analog signal provided by the degradation detection sensor;

determining, by the microcomputer included in the DAU, a degree of risk by comparing the degradation detection data with at least one predetermined risk determination reference value; and adjusting, by the microcomputer included in the DAU, the acquisition number and transmission rate of data by, if the degree of risk is high, increasing a sampling rate that is a number of sampling times of detection data per unit time in the analog-digital converter and simultaneously increasing a report rate that is a time required to transmit data of a predetermined number, and, if the degree of risk is low, decreasing the sampling rate of the analog-digital converter and simultaneously decreasing the report rate.

According to one aspect of this invention, the degradation detection sensor is configured with a plurality of sensors respectively corresponding to a plurality of electric power utilities, and wherein the analog-digital converter comprises:

a plurality of sample and hold circuit sections respectively provided to correspond to the plurality of degradation detection sensors, to sample and maintain the degradation detection signal from each of the plurality of degradation sensors at a sampling rate under control of the microcomputer;

a multiplexer connected to the plurality of sample and hold circuit sections, to select any one of the plurality of sample and hold circuit sections in response to a selection control signal of the microcomputer and receive an output signal from the selected sample and hold circuit section; and an analog-digital converting circuit section configured to compare, with a plurality of reference values, a degradation status value of the electric power utilities, which is represented by the degradation detection signal received by the multiplexer, and perform quantization on the degradation status value.

According to another aspect of this invention, the on-line status diagnosis method according to this invention further comprises transmitting the acquired degradation detection data to the outside of the on-line status diagnosis device.

According to still another aspect of this invention, the adjusting of the acquisition number and transmission rate of the data in the on-line status diagnosis method according to this invention, comprises, if the degradation status value according to the degradation detection data is equal to or smaller than a first reference value where the degree of risk is lowest among a plurality of risk determination reference values, determining the degree of risk as a level where the degree of risk is to be neglected, and not transmitting the acquired degradation detection data to a supervisory device but performing only a status display Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWING

The accompanying drawings, which are included to provide a further understanding of the disclosure and are incorporated in and constitute a part of this disclosure, illustrate exemplary embodiments and together with the description serve to explain the principles of the disclosure.

In the drawings.

DETAILED DESCRIPTION OF EXEMPLARY EMBODIMENTS

Description will now be given in detail of the exemplary embodiments, with reference to the accompanying drawings. For the sake of brief description with reference to the drawings, the same or equivalent components will be provided with the same reference numbers, and description thereof will not be repeated.

Figure 3:
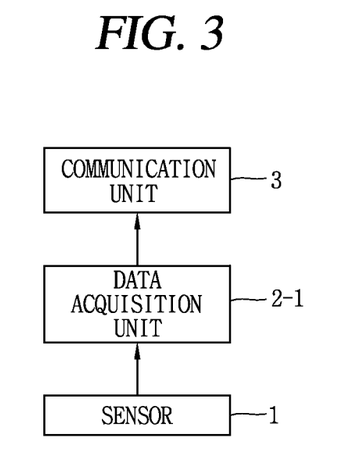
FIG. 3 is a block diagram illustrating a configuration of an on-line status diagnosis device for electric power utility according to a first exemplary embodiment of the present invention.

As can be seen in FIG. 3, an on-line status diagnosis device for an electric power utility according to a first exemplary embodiment comprises a sensor 1, a DAU 2-1, and a communication unit 3.

The sensor 1 is a degradation detection sensor which provides a degradation detection signal as an electrical analog signal by detecting a degradation status of the electric power utility. For example, like the conventional art, the sensor 1 may be configured as a partial discharging sensor which provides an electrical detection signal by sensing a partial discharging signal generated based on a degradation status of the electric power utility.

Korean Patent No. KR10-1352520 B1, allowed to the applicant of the present disclosure, can be referred to as an example of the partial discharging sensor.

The DAU 2-1 is a means connected to the sensor 1 to acquire and provide degradation detection data based on the degradation detection signal from the sensor 1, i.e., magnitude data of a partial discharging signal.

Figure 4:
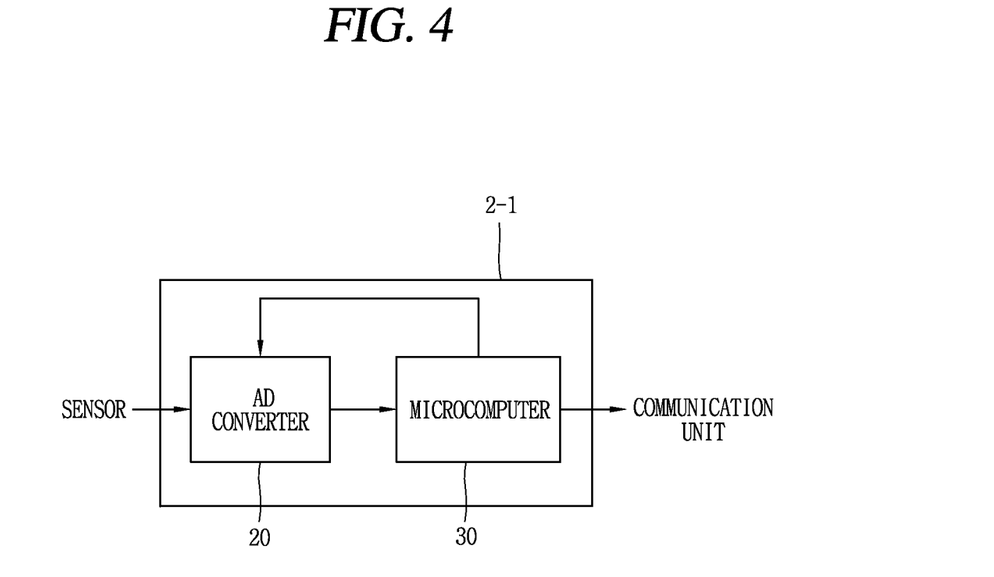
FIG. 4 is a block diagram illustrating a configuration of a DAU in the on-line status diagnosis device for the electric power utilities according to the first exemplary embodiment of the present invention.

The DAU 2-1, as can be seen in FIG. 4, comprises an analog-digital converter 20 and a microcomputer 30.

The analog-digital converter 20 is a means connected to an output terminal of the sensor 1 to acquire degradation detection data as digital data by converting a degradation detection signal from the sensor 1 into a digital signal.

Figure 6:
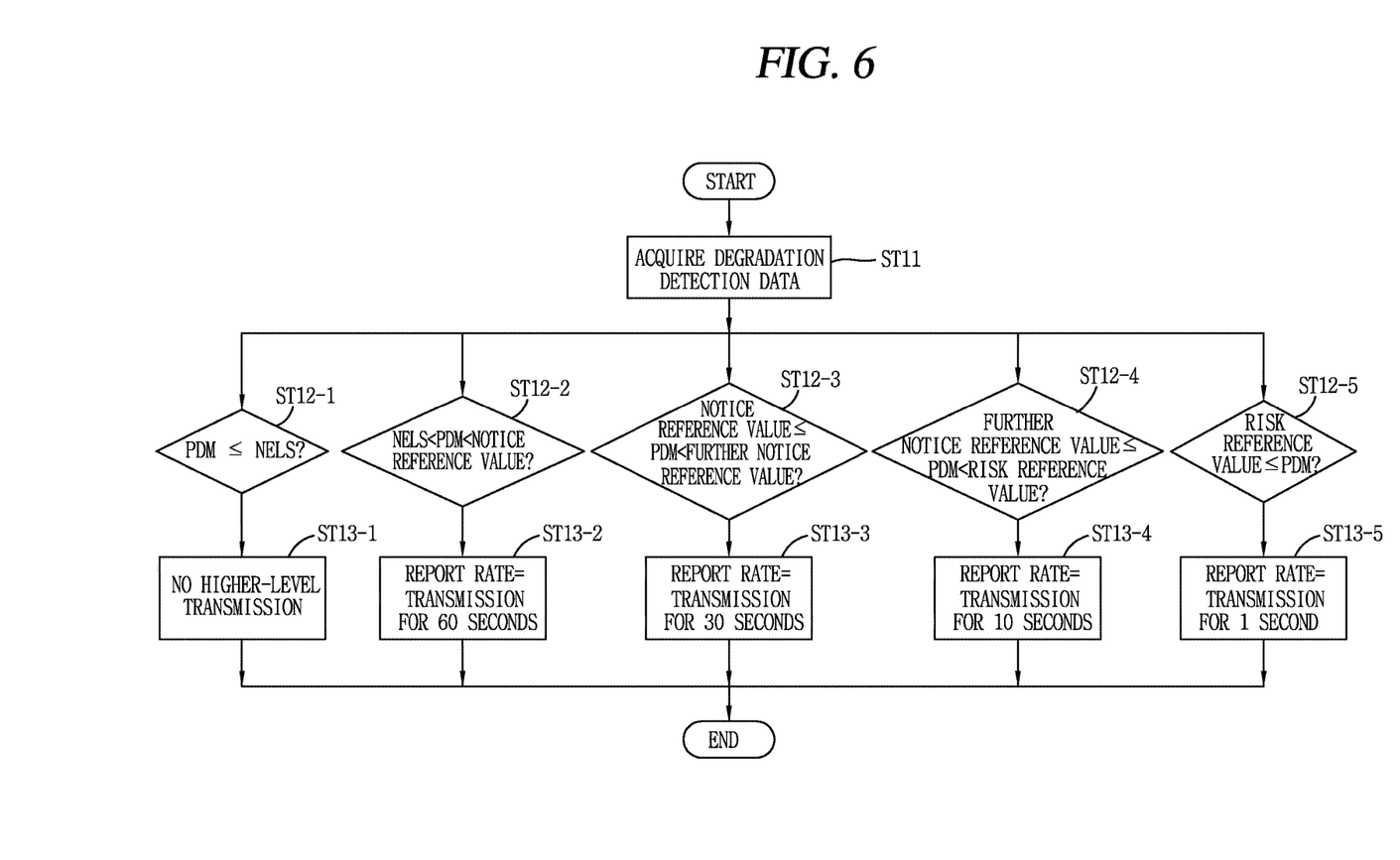
FIG. 6 is a flowchart illustrating a configuration of an on-line status diagnosis method for an electric power utilities according to an exemplary embodiment of the present invention.

The microcomputer 30 determines a degree of risk by comparing the degradation detection data with at least one predetermined risk determination reference value. According to an exemplary embodiment, the risk determination reference value may be set to four values as shown in FIG. 6.

The corresponding four risk determination reference values are a first risk determination reference value having a level where the degree of risk is to be neglected, a second risk determination reference value having a level where the degree of risk is to be noticed as a value greater than the first risk determination reference value, a third risk determination reference value as a level where the degree of risk to be further noticed having a value greater than the second risk determination reference value, and a fourth risk determination reference value having a level where the degree of risk is dangerous as a value greater than the third risk determination reference value. The first to fourth risk determination reference values are values input by a setting input means e.g., a program loader accessible to the microcomputer 30.

If the degree of risk is high as the comparison result, the microcomputer 30 outputs a control signal to the analog-digital converter 20 to increase a sampling rate that is a number of sampling times of detection data per unit time in the analog-digital converter 20.

If the degree of risk is high as the comparison result, the microcomputer 30 outputs the degradation detection data to quicken a report rate that is a time required to transmit data of a predetermined number. For example, if the degree of risk is high in a state in which the number of degradation detection data to be transmitted is sixty, the microcomputer 30 transmits the sixty degradation detection data through the communication unit 3 for one second.

If the degree of risk is low as the comparison result, the microcomputer 30 outputs a control signal to the analog-digital converter 20 to decrease the sampling rate of the analog-digital converter 20.

If the degree of risk is low as the comparison result, the microcomputer 30 outputs the degradation detection data to decrease the report rate that is the time required to transmit data of the predetermined number. As the degree of risk becomes lower, the microcomputer 30, as can be seen in FIG. 6, may transmit, for example, the sixty degradation detection data for ten seconds, thirty seconds, and sixty seconds.

The communication unit 3 transmits the degradation detection data from the DAU 2-1 to the outside of the on-line status diagnosis device. In other words, the communication unit 3 transmits the degradation detection data provided from the microcomputer 3 to the outside of the on-line status diagnosis device. Here, it can be construed that the outside means a higher-level supervisory device (hereinafter, referred to as a supervisory device), e.g., a supervisory control and data acquisition (typically, abbreviated as "SCADA") system.

Meanwhile, a configuration of an on-line status diagnosis device for electric power utilities according to a second exemplary embodiment of the present invention will be described with reference to FIG. 5.

Figure 5:
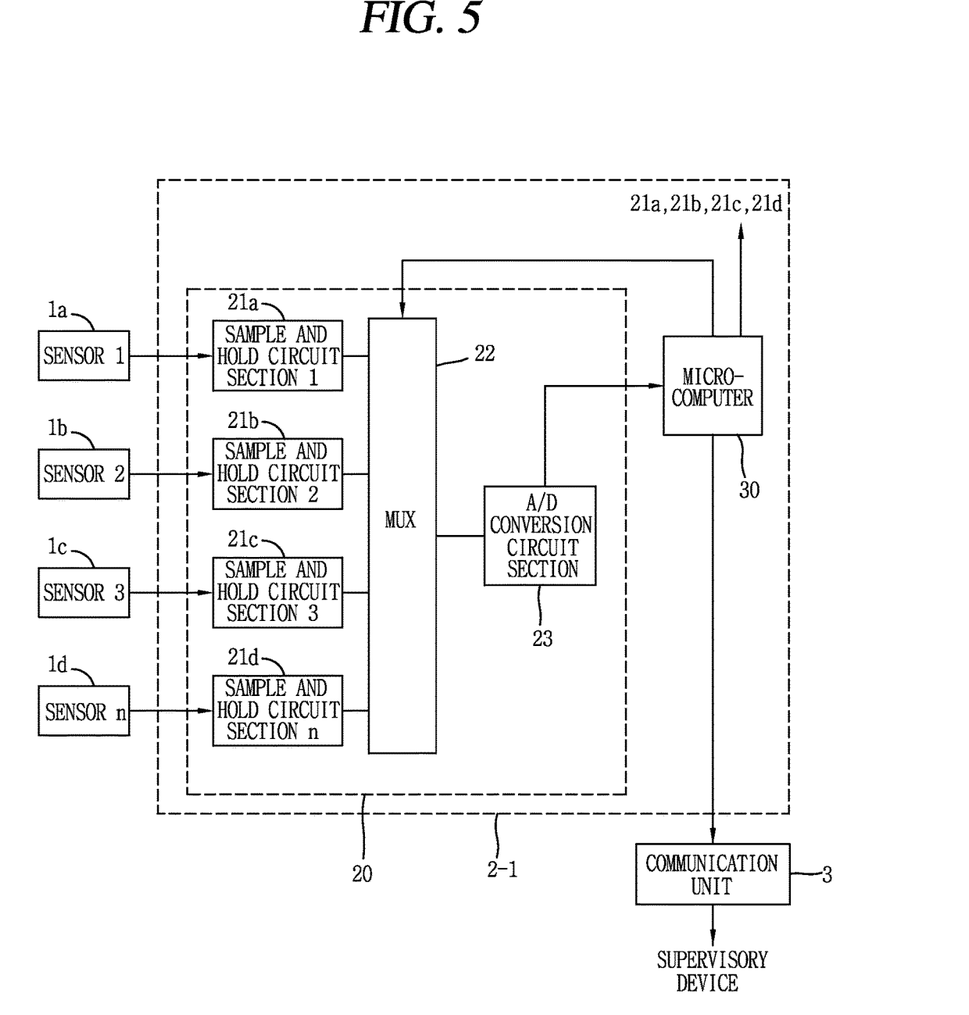
FIG. 5 is a block diagram illustrating a configuration of an on-line status diagnosis device for electric power utilities according to second exemplary embodiment of the present invention.

The on-line status diagnosis device of the second exemplary embodiment described with reference to FIG. 5 is different from the on-line status diagnosis device of the above-described first exemplary embodiment in that, while the on-line status diagnosis device of the above-described first embodiment of this invention is a device capable of performing on-line status diagnosis on one electric power utility, the on-line status diagnosis device of the second exemplary embodiment of this invention is a device capable of performing on-line status diagnosis on a plurality of electric power utilities. In addition, the configuration of the analog-digital converter 20 in the on-line status diagnosis device of the second exemplary embodiment of this invention is different from the configuration of the analog-digital converter 20 in the on-line status diagnosis device of the above-described first exemplary embodiment.

Therefore, the exemplary embodiment will be described based on the differences.

In FIG. 5, the on-line status diagnosis device for the electric power utilities according to the exemplary embodiment includes a plurality of sensors 1a, 1b, 1c, and 1d, a DAU 2-1, and a communication unit 3.

The plurality of sensors 1a, 1b, 1c, and 1d are provided to respectively correspond to a plurality of electric power utilities. Like the above-described first embodiment, each of the plurality of sensors 1a, 1b, 1c, and 1d may be configured as a partial discharging sensor which provides an electrical detection signal by sensing a partial discharging signal generated based on a degradation status of a corresponding electric power utilities.

In the on-line status diagnosis device for the electric power utilities according to the second embodiment, the DAU 2-1 comprises an analog-digital converter 20 and a microcomputer 30.

Here, the analog-digital converter 20 according to the second embodiment may comprise a plurality of sample and hold circuit sections 21a, 21b, 21c, and 21d, a multiplexer 22, and an analog-digital conversion circuit section 23.

The plurality of sample and hold circuit sections 21a, 21b, 21c, and 21d are provided to respectively correspond to the plurality of sensors 1a, 1b, 1c, and 1d, to sample and maintain (in other words "hold") a degradation detection signal from each of the plurality of sensors 1a, 1b, 1c, and 1d at a sampling rate under control of the microcomputer 30 and convert sampling values of analog signals into digital values.

The multiplexer 22 is connected to the plurality of sample and hold circuit sections 21a, 21b, 21c, and 21d, to select any one of the plurality of sample and hold circuit sections 21a, 21b, 21c, and 21d in response to a selection control signal of the microcomputer 30 and receive and provide an output signal from the selected sample and hold circuit section.

The analog-digital conversion circuit section 23 compares, with a plurality of reference values, a degradation status value of the electric power utility, which is represented by a sampled and held value of the degradation detection signal received by the multiplexer 22 from the one selected from the sample and hold circuit sections 21a, 21b, 21c, and 21d, and performs quantization, i.e., digitization on the degradation status value. Here, the reference value is a digital value closest to an analog measurement value. The number of reference values may be determined according to the performance of the analog digital converter 20.

The degradation detection data digitized by the analog-digital conversion circuit section 23 is transmitted to the microcomputer 30. Subsequently, the configurations and operations of the microcomputer 30 and the communication unit 3 are identical to those of the above-described first embodiment, and therefore, their descriptions will be omitted to avoid redundancy.

Meanwhile, a configuration of an on-line status diagnosis method for an electric power utilities according to an exemplary embodiment and an operation of the on-line status diagnosis device according to the present disclosure will be described with FIG. 6 in conjunction with FIGS. 3 to 5.

The on-line status diagnosis method for the electric power utilities according to the exemplary embodiment of this invention uses the sensor 1 as a degradation detection sensor which provides a degradation detection signal as an electrical analog signal by detecting a degradation status of the electric power utilities, the DAU 2-1 which acquires and provides degradation detection data based on the degradation detection signal and comprises the analog-digital converter 20 and the microcomputer 30, and the communication unit 3 which transmits the degradation detection data from the DAU 2-1 to the outside of the on-line status diagnosis device.

The on-line status diagnosis method for the electric power utilities according to the exemplary embodiment of this invention comprises a data acquisition step ST11, a risk determination steps ST12-1, ST12-2, ST12-3, ST12-4, and ST12-5, and a data acquisition and transmission adjusting steps ST13-1, ST13-2, ST13-3, ST13-4, and ST13-5.

Here, the data acquisition step ST11 is a step in which, based on a degradation detection signal that is an analog signal provided from each of the sensors 1, 1a, 1b, 1c, and 1d as degradation detection sensors, the analog-digital converter 20 included in the DAU 2-1 converts the degradation detection signal into a digital signal, thereby acquiring degradation detection data.

The risk determination steps ST12-1, ST12-2, ST12-3, ST12-4, and ST12-5 are steps in which the microcomputer 30 included in the DAU 2-1 compares the degradation detection data with at least one predetermined risk reference value, thereby determining a degree of risk.

In the risk determination steps ST12-1, ST12-2, ST12-3, ST12-4, and ST12-5, a first risk determination step ST12-1 is a step of comparing the value according to the magnitude data of a partial discharging signal (abbreviated as "PDM data" hereinafter) as the degradation detection data with a first risk determination reference value as a level where a degree of risk, which is previously set and stored, is to be neglected.

If the value according to the PDM data as the degradation detection data is equal to or smaller than the first risk determination reference value in the first risk determination step ST12-1, the on-line status diagnosis method (operation of the on-line status diagnosis device) proceeds to a first data acquisition and transmission adjusting step ST13-1 in the data acquisition and transmission adjusting steps ST13-1, ST13-2, ST13-3, ST13-4, and ST13-5.

If the value according to the PDM data as the degradation detection data is greater than the first risk determination reference value in the first risk determination step ST12-1, the on-line status diagnosis method (operation) proceeds to a second risk determination step ST12-2 in the risk determination step ST12-1, ST12-2, ST12-3, ST12-4, and ST12-5.

In the risk determination step ST12-1, ST12-2, ST12-3, ST12-4, and ST12-5, the second risk determination step ST12-2 is a step of comparing the value according to the PDM data as the degradation detection data with a second risk determination reference value which is previously set and stored as a level where the degree of risk is to be noticed as a value greater than the first risk determination reference value.

If the value according to the PDM data as the degradation detection data is greater than the first risk determination reference value and smaller than the second risk determination reference value in the second risk determination step ST12-2, the on-line status diagnosis method (operation) proceeds to a second data acquisition and transmission adjusting step ST13-2 in the data acquisition and transmission adjusting step ST13-1, ST13-2, ST13-3, ST13-4, and ST13-5.

If the value according to the PDM data as the degradation detection data is equal to or greater than the second risk determination reference value in the second risk determination step ST12-2, the on-line status diagnosis method proceeds to a third risk determination step ST12-3 in the risk determination step ST12-1, ST12-2, ST12-3, ST12-4, and ST12-5.

In the risk determination step ST12-1, ST12-2, ST12-3, ST12-4, and ST12-5, the third risk determination step ST12-3 is a step of comparing the value of the PDM data as the degradation detection data with a third risk determination reference value which is previously set and stored as a level where the degree of risk is to be further noticed as a value greater than the second risk determination reference value.

If the value according to the PDM data as the degradation detection data is equal to or greater than the second risk determination reference value and smaller than the third risk determination value in the third risk determination step ST12-3, the on-line status diagnosis method proceeds to a third data acquisition and transmission adjusting step ST13-3 in the data acquisition and transmission adjusting step ST13-1, ST13-2, ST13-3, ST13-4, and ST13-5.

If the value according to the PDM data as the degradation detection data is equal to or greater than the third risk determination reference value in the third risk determination step ST12-3, the on-line status diagnosis method (operation of the on-line status diagnosis device) proceeds to a fourth risk determination step ST12-4 in the risk determination step ST12-1, ST12-2, ST12-3, ST12-4, and ST12-5.

In the risk determination step ST12-1, ST12-2, ST12-3, ST12-4, and ST12-5, the fourth risk determination step ST12-4 is a step of comparing the value of the PDM data as the degradation detection data with a fourth risk determination reference value which is previously set and stored as a level where the degree of risk is dangerous (most dangerous and urgent) as a value greater than the third risk determination reference value.

If the value according to the PDM data as the degradation detection data is equal to or greater than the third risk determination reference value and smaller than the fourth risk determination value in the fourth risk determination step ST12-4, the on-line status diagnosis method (operation of the on-line status diagnosis device) proceeds to a fourth data acquisition and transmission adjusting step ST13-4 in the data acquisition and transmission adjusting step ST13-1, ST13-2, ST13-3, ST13-4, and ST13-5.

If the value according to the PDM data as the degradation detection data is greater than the fourth risk determination reference value in the fourth risk determination step ST12-4, the on-line status diagnosis method proceeds to a fifth risk determination step ST12-5 in the risk determination step ST12-1, ST12-2, ST12-3, ST12-4, and ST12-5.

That the on-line status diagnosis method proceeds to the fifth risk determination step ST12-5 means that the value according to the PDM data as the degradation detection data is equal to or greater than the fourth risk determination reference value as the level where the degree of risk, which is previously set and stored, is dangerous (most dangerous and urgent) as the value greater than the third risk determination reference value. Therefore, the on-line status diagnosis method proceeds to a fifth data acquisition and transmission adjusting step ST13-5 in the data acquisition and transmission adjusting step ST13-1, ST13-2, ST13-3, ST13-4, and ST13-5 without comparing the PDM data as the degradation detection data with any risk determination reference value.

The data acquisition and transmission adjusting steps ST13-1, ST13-2, ST13-3, ST13-4, and ST13-5 are the steps in which, if the determined degree of risk is high, the microcomputer 30 included in the DAU 2-1 increases a sampling rate that is a number of sampling times of the degradation detection data per unit time in the analog-digital converter 20 and simultaneously quickens a report rate that is a time required to transmit data of a predetermined number, and if the determined degree of risk is low, the microcomputer 30 decreases the sampling rate of the analog-digital converter 20 and simultaneously slows down the report rate, thereby adjusting the acquisition number and transmission rate of the degradation detection data based on the degree of risk of the degradation detection data.

First, in the first data acquisition and transmission adjusting step ST13-1, the acquired degradation detection data is not transmitted to the supervisory device, and only a status display is performed. Here, the status display may be performed by a display device (not shown), such as a liquid crystal display, which may be included in an on-line status diagnosis device of an electric power utilities according to a preferred embodiment of the present invention, in response to a display control signal from the microcomputer 30.

In the second data acquisition and transmission adjusting step ST13-2, the microcomputer 30 increases the sampling rate that is the number of sampling times of the degradation detection data per unit time in the analog-digital converter 20 and simultaneously sets, to 60 seconds, the report rate that is the time required to transmit degradation status data of a predetermined number, e.g., sixty (60) degradation detection data, thereby completing transmission of the degradation detection data through the communication unit 3 for the 60 seconds.

In the third data acquisition and transmission adjusting step ST13-3, the microcomputer 30 increases the sampling rate that is the number of sampling times of the degradation detection data per unit time in the analog-digital converter 20 and simultaneously sets, to 30 seconds, the report rate that is the time required to transmit degradation status data of a predetermined number, e.g., 60 degradation detection data, thereby completing transmission of the degradation detection data through the communication unit 3 for the 30 seconds.

In the fourth data acquisition and transmission adjusting step ST13-4, the microcomputer 30 increases the sampling rate that is the number of sampling times of the degradation detection data per unit time in the analog-digital converter 20 and simultaneously sets, to 10 seconds, the report rate that is the time required to transmit degradation status data of a predetermined number, e.g., 60 degradation detection data, thereby completing transmission of the degradation detection data through the communication unit 3 for the 10 seconds.

In the fifth data acquisition and transmission adjusting step ST13-5, the microcomputer 30 increases the sampling rate that is the number of sampling times of the degradation detection data per unit time in the analog-digital converter 20 and simultaneously sets, to 1 second, the report rate that is the time required to transmit degradation status data of a predetermined number, e.g., 60 degradation detection data, thereby completing transmission of the degradation detection data through the communication unit 3 for the 1 second.

The on-line status diagnosis method according to the exemplary embodiment may further include a communication step of transmitting, to the outside, e.g., a supervisory device such as an SCADA system, the degradation detection data that the analog-digital converter 20 acquires and the microcomputer transmits through data acquisition and transmission adjusting.

An operation of the on-line status diagnosis devices according to the exemplary embodiments will be described with FIGS. 3 to 5 and 6.

Based on a degradation detection signal that is an analog signal provided from each of the sensors 1, 1a, 1b, 1c, and 1d as degradation detection sensors, e.g., partial discharging sensors, which detect a degradation status or degradation statuses of an electric power utilities or a plurality of electric power utilities, the analog-digital converter 20 included in the DAU 2-1 acquire degradation detection data by converting the degradation detection signal into a digital signal.

Next, in the risk determination step ST12-1, ST12-2, ST12-3, ST12-4, and ST12-5, the microcomputer 30 included in the DAU 2-1 determines a degree of risk by comparing the degradation detection data with the previously set first to fourth risk determination reference values.

In the step of determining the degree of risk, if it is determined that the degree of risk is the level where the degree of risk is to be neglected, the microcomputer 30 does not transmit the acquired degradation detection data, and only the status display is performed. In this case, the microcomputer 30 does not increase the sampling rate that is the number of sampling times of the degradation detection data per unit time.

In the step of determining the degree of risk, if it is determined that the degree of risk exceeds the level wherein the degree of risk is to be neglected but does not reach the level where the degree of risk is to be noticed, the microcomputer 30 increases the sampling rate that is the number of sampling times of the degradation detection data per unit time in the analog-digital converter 20 and simultaneously sets, to 60 seconds, the report rate that is the time required to transmit degradation status data of a predetermined number, e.g., 60 degradation detection data, thereby completing transmission of the degradation detection data through the communication unit 3 for the 60 seconds.

In the step of determining the degree of risk, if it is determined that the degree of risk is the level where the degree of risk is to be noticed, the microcomputer 30 increases the sampling rate that is the number of sampling times of the degradation detection data per unit time in the analog-digital converter 20 and simultaneously sets, to 30 seconds, the report rate that is the time required to transmit degradation status data of a predetermined number, e.g., 60 degradation detection data, thereby completing transmission of the degradation detection data through the communication unit 3 for the 30 seconds.

In the step of determining the degree of risk, if it is determined that the degree of risk is the level where the degree of risk is to be further noticed, the microcomputer 30 increases the sampling rate that is the number of sampling times of the degradation detection data per unit time in the analog-digital converter 20 and simultaneously sets, to 10 seconds, the report rate that is the time required to transmit degradation status data of a predetermined number, e.g., 60 degradation detection data, thereby completing transmission of the degradation detection data through the communication unit 3 for the 10 seconds.

In the step of determining the degree of risk, if it is determined that the degree of risk is the level where the degree of risk is dangerous, the microcomputer 30 increases the sampling rate that is the number of sampling times of the degradation detection data per unit time in the analog-digital converter 20 and simultaneously sets, to 1 second, the report rate that is the time required to transmit degradation status data of a predetermined number, e.g., 60 degradation detection data, thereby completing transmission of the degradation detection data through the communication unit 3 for the 1 second.

As described above, in the on-line status diagnosis device and the on-line status diagnosis method according to the present disclosure, the sampling rate and transmission rate of degradation detection data having a high degree of risk (importance) are increased (accelerated), to acquire a large number of degradation detection data and quickly transmit the degradation detection data. On the other hand, the sampling rate and transmission rate of degradation detection data having a low degree of risk (importance) are decreased (decelerated), to acquire a small number of degradation detection data and slowly transmit the degradation detection data, thereby reducing a communication load and a database load. Further, it is possible to extend the lifetime of the DAU included in the on-line status diagnosis device.

In the on-line status diagnosis device according to the present disclosure, the degradation detection sensor is configured with a plurality of sensors respectively corresponding to a plurality of electric power utilities, and the analog digital converter includes a plurality of sample and hold circuit sections respectively provided to correspond to the plurality of degradation detection sensors, to sample and maintain a degradation detection signal from each of the plurality of degradation sensors at a sampling rate under control of the microcomputer, a multiplexer connected to the plurality of sample and hold circuit sections, to select any one of the plurality of sample and hold circuit sections in response to a selection control signal of the microcomputer and receive an output signal from the selected sample and hold circuit section, and an analog-digital conversion circuit section configured to compare, with a plurality of reference values, a degradation status value of the electric power utilities, which is represented by the degradation detection signal received by the multiplexer, and perform quantization on the degradation status value. Thus, it is possible to efficiently monitor and diagnose a plurality of electric power utilities at the same time.

The on-line status diagnosis method according to the present disclosure further includes a communication step of transmitting acquired data to the outside, so that the acquired data is transmitted to, for example, an external supervisory device such as an SCADA system, thereby performing display, analysis, or diagnosis.

In the on-line status diagnosis method according to the present disclosure, the data acquisition and transmission adjusting step includes a step of, if the degradation status value according to the degradation detection data is equal to or smaller than a first reference value among a plurality of risk determination reference values, determining that the degree of risk as a level where the degree of risk is to be neglected, and not transmitting the acquired degradation detection data to the supervisory device but performing only a status display. Thus, when the degree of risk is the level where the degree of risk is to be neglected, a report to the supervisory device is omitted, so that it is possible to further improve communication efficiency and database efficiency.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An on-line status diagnosis device for electric power utilities, which comprises a degradation detection sensor configured to provide a degradation detection signal as an electrical analog signal by detecting a degradation status of the electric power utilities, a data acquisition unit (DAU) configured to acquire and provide degradation detection data based on the degradation detection signal, and a communication unit configured to transmit the degradation detection data from the DAU to the outside of the on-line status diagnosis device, wherein the DAU comprises:

an analog-digital converter configured to acquire degradation detection data as digital data by converting the degradation detection signal from the degradation detection sensor into a digital signal; and a microcomputer configured to determine a degree of risk by comparing the degradation detection data with at least one predetermined risk determination reference value, if the degree of risk is high, output a control signal to the analog-digital converter to increase a sampling rate that is a number of sampling times of detection data per unit time in the analog-digital converter and also output the degradation detection data to quicken a report rate that is a time required to transmit data of a predetermined number, and if the degree of risk is low, output a control signal to the analog-digital converter to decrease the sampling rate of the analog-digital converter and also output the degradation detection data to decrease the report rate.

2. The on-line status diagnosis device of claim 1, wherein the degradation detection sensor is configured with a plurality of sensors respectively corresponding to a plurality of electric power utilities, and wherein the analog-digital converter comprises:

a plurality of sample and hold circuit sections respectively provided to correspond to the plurality of degradation detection sensors, to sample and maintain the degradation detection signal from each of the plurality of degradation sensors at a sampling rate under control of the microcomputer;

a multiplexer connected to the plurality of sample and hold circuit sections, to select any one of the plurality of sample and hold circuit sections in response to a selection control signal of the microcomputer and receive an output signal from the selected sample and hold circuit section; and an analog-digital converting circuit section configured to compare, with a plurality of reference values, a degradation status value of the electric power utilities, which is represented by the degradation detection signal received by the multiplexer, and perform quantization on the degradation status value.

3. An on-line status diagnosis method for electric power utilities, which uses a degradation detection sensor configured to provide a degradation detection signal as an electrical analog signal by detecting a degradation status of the electric power utilities, a DAU configured to acquire and provide degradation detection data based on the degradation detection signal and having an analog-digital converter and a microcomputer, and a communication unit configured to transmit the degradation detection data from the DAU to the outside of an on-line status diagnosis device, the on-line status diagnosis method comprising:

acquiring, by the analog-digital converter included in the DAU, degradation detection data by converting the degradation detection signal into a digital signal, based on an analog signal provided by the degradation detection sensor;

determining, by the microcomputer included in the DAU, a degree of risk by comparing the degradation detection data with at least one predetermined risk determination reference value; and adjusting, by the microcomputer included in the DAU, an acquisition number and transmission rate of data by, if the degree of risk is high, increasing a sampling rate that is a number of sampling times of detection data per unit time in the analog-digital converter and simultaneously increasing a report rate that is a time required to transmit data of a predetermined number, and, if the degree of risk is low, decreasing the sampling rate of the analog-digital converter and simultaneously decreasing the report rate.

4. The on-line status diagnosis method of claim 3, further comprising transmitting the acquired degradation detection data to the outside of the on-line status diagnosis device.

5. The on-line status diagnosis method of claim 3, wherein the adjusting of the acquisition number and transmission rate of the data comprises, if the degradation status value according to the degradation detection data is equal to or smaller than a first reference value where the degree of risk is lowest among a plurality of risk determination reference values, determining the degree of risk as a level where the degree of risk is to be neglected, and not transmitting the acquired degradation detection data to a supervisory device but performing only a status display.

* * * * *